United States Patent
Chang et al.

(10) Patent No.: US 9,209,071 B2
(45) Date of Patent: Dec. 8, 2015

(54) SEMICONDUCTOR STRUCTURE WITH ANTI-ETCH STRUCTURE IN VIA AND METHOD FOR MANUFACTURING THE SAME

(71) Applicant: Taiwan Semiconductor Manufacturing CO., LTD., Hsinchu (TW)

(72) Inventors: Geng-Shuoh Chang, Taipei (TW); Chun-Sheng Wu, Hsinchu (TW); Chun-Li Lin, Hsinchu (TW); Yi-Fang Li, Hemei Township (TW); Po-Hsiung Leu, Lujhu Township (TW); Ding-I Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 126 days.

(21) Appl. No.: 14/229,264

(22) Filed: Mar. 28, 2014

(65) Prior Publication Data

US 2015/0279729 A1    Oct. 1, 2015

(51) Int. Cl.
*H01L 21/4763*  (2006.01)
*H01L 21/768*  (2006.01)
*H01L 23/522*  (2006.01)
*H01L 23/532*  (2006.01)

(52) U.S. Cl.
CPC ...... *H01L 21/76831* (2013.01); *H01L 21/7684* (2013.01); *H01L 21/76805* (2013.01); *H01L 21/76832* (2013.01); *H01L 21/76883* (2013.01); *H01L 23/5226* (2013.01); *H01L 23/5329* (2013.01); *H01L 23/53209* (2013.01)

(58) Field of Classification Search
CPC .................. H01L 21/76831; H01L 21/76805; H01L 21/76883; H01L 21/7684; H01L 23/5226; H01L 23/53209; H01L 23/5329
USPC .......................... 438/627, 628, 634, 637, 638
See application file for complete search history.

(56) References Cited

U.S. PATENT DOCUMENTS

| | | | |
|---|---|---|---|
| 4,845,048 A * | 7/1989 | Tamaki .................... | H01L 21/32 148/DIG. 117 |
| 6,740,592 B1 * | 5/2004 | Doong .............. | H01L 21/76897 257/E21.507 |
| 2008/0274614 A1 * | 11/2008 | Kim .................. | H01L 21/76808 438/675 |

* cited by examiner

*Primary Examiner* — Kevin M Picardat

(57) ABSTRACT

A semiconductor structure includes a semiconductor substrate, a dielectric layer formed over the semiconductor substrate, a first anti-etch layer, a second anti-etch layer and a conductive material. The dielectric layer has an opening. The first anti-etch layer is formed on the sidewall of the opening and made of a material having resistance to peroxide. The second anti-etch layer is formed over the first anti-etch layer and made of a material having resistance to acid. The conductive material is formed within the opening and in contact with the second anti-etch layer.

20 Claims, 10 Drawing Sheets

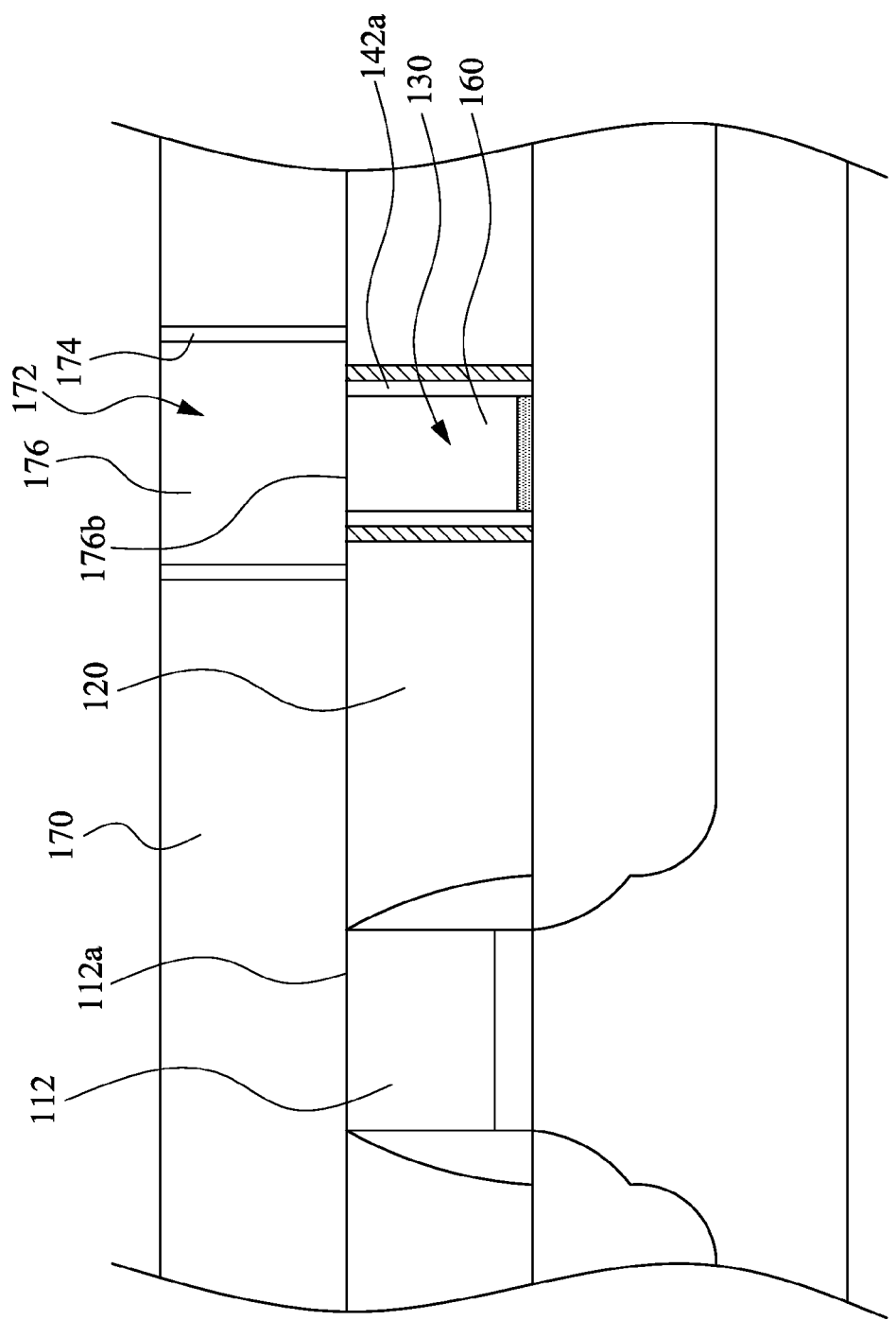

SEMICONDUCTOR STRUCTURE WITH ANTI-ETCH STRUCTURE IN VIA AND METHOD FOR MANUFACTURING THE SAME

BACKGROUND

The semiconductor integrated circuit (IC) industry has experienced rapid growth. Technological progress in IC manufacture has produced several generations of ICs, and each generation fabricates smaller and more complex circuits than the previous generation. ICs are made up of a number of active devices and passive devices. These devices are further interconnected together to form a functional circuit. Typical interconnect structures include lateral interconnections such as metal lines, and vertical interconnections such as via contacts. The density of active and passive devices in modern integrated circuits is significantly increased, and therefore the distance between a via contact and another device is considerably decreased. Various issues arise when the distance between a via contact and an active device decreases to a certain value.

BRIEF DESCRIPTION OF THE DRAWINGS

The disclosure can be more fully understood by reading the following detailed description of the embodiments, with reference made to the accompanying drawings as follows:

FIGS. 1-10 are cross-sectional views schematically illustrating methods for forming semiconductor structures according to various embodiments of the present disclosure.

DETAILED DESCRIPTION

Figure 1:
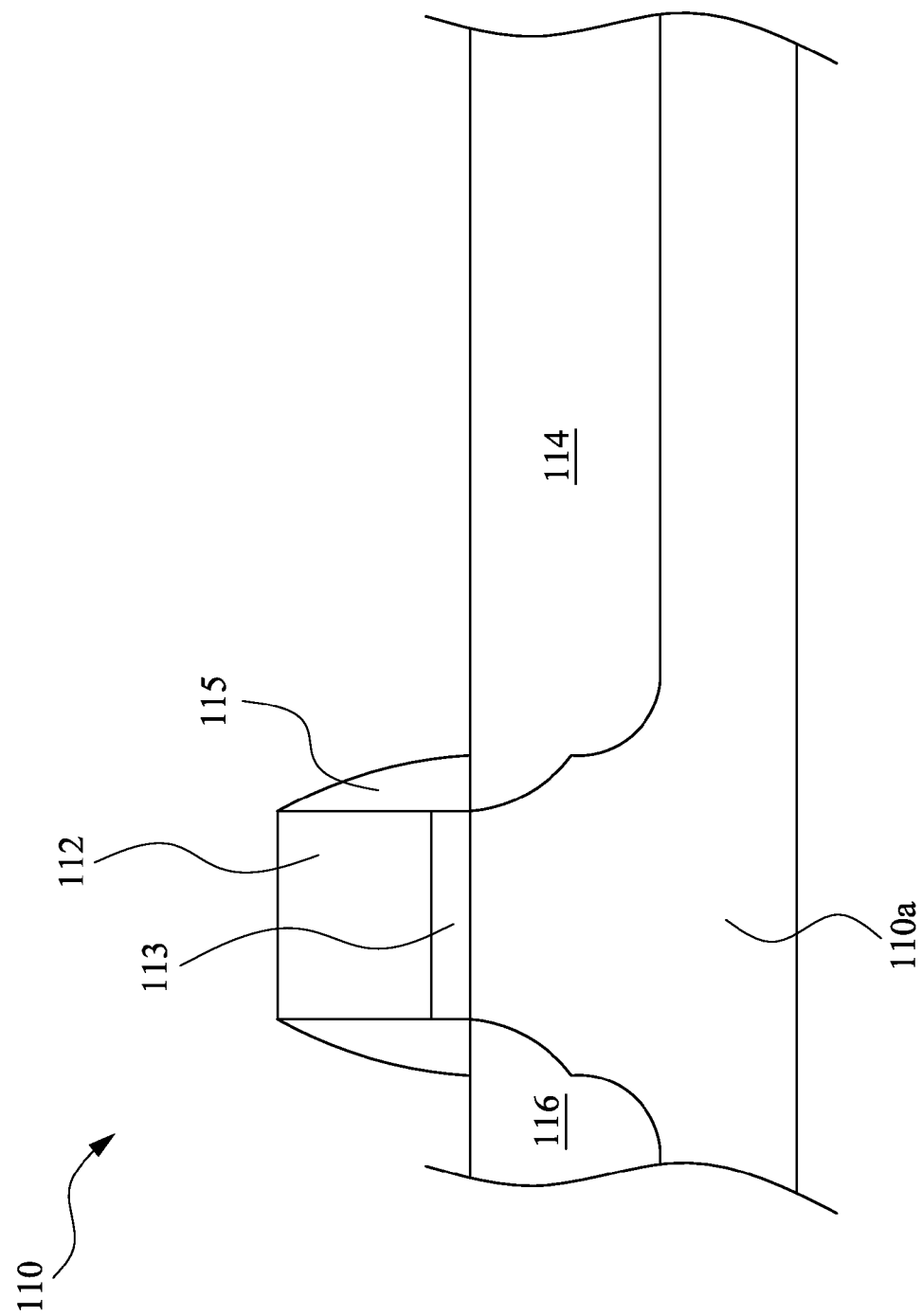

In the following detailed description, for purposes of explanation, numerous specific details are set forth in order to provide a thorough understanding of the disclosed embodiments. It will be apparent, however, that one or more embodiments may be practiced without these specific details. In the drawings, the thickness and width of layers and regions may be exaggerated for clarity. Like reference numerals in the drawings denote like elements. The elements and regions illustrated in the figures are schematic in nature, and thus relative sizes or intervals illustrated in the figures are not intended to limit the scope of the present disclosure.

The present disclosure relates generally to semiconductor structures and methods for manufacturing the semiconductor structures. Specific examples of components and arrangements are described below to simplify the present disclosure. These are, of course, merely examples and are not intended to be limiting. For instance, the formation of a first feature over or on a second feature in the description may include embodiments in which the first and second features are formed in direct contact, and may also include embodiments in which additional features may be formed between the first and second features, such that the first and second features may not be in direct contact. Additionally, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "beneath," "above," "vertical," "horizontal" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1-10 are schematic cross-sectional views showing methods for manufacturing semiconductor structures according to various embodiments of the present disclosure.

As shown in FIG. 1, a semiconductor substrate 110 is provided. In some embodiments, the semiconductor substrate 110 includes a bulk substrate 110a, a metallic gate electrode 112, a source region 114 and a drain region 116. The bulk substrate 110a may include, for example, a silicon wafer, a semiconductor-on-insulator (SOI) substrate or a silicon germanium substrate. The metallic gate electrode 112 is disposed on an active area of the bulk substrate 110a. The source and drain regions 114, 116 may be, for example, heavily doped regions formed in the bulk substrate 110a, and are arranged at opposite sides of the metallic gate electrode 112. In some embodiments, the semiconductor substrate 110 further includes a gate dielectric layer 113 interposed between the metallic gate electrode 112 and the bulk substrate 110a. In yet some embodiments, the semiconductor substrate 110 further includes a sidewall spacer 115 formed on the sidewalls of the metallic gate electrode 112.

Figure 2:
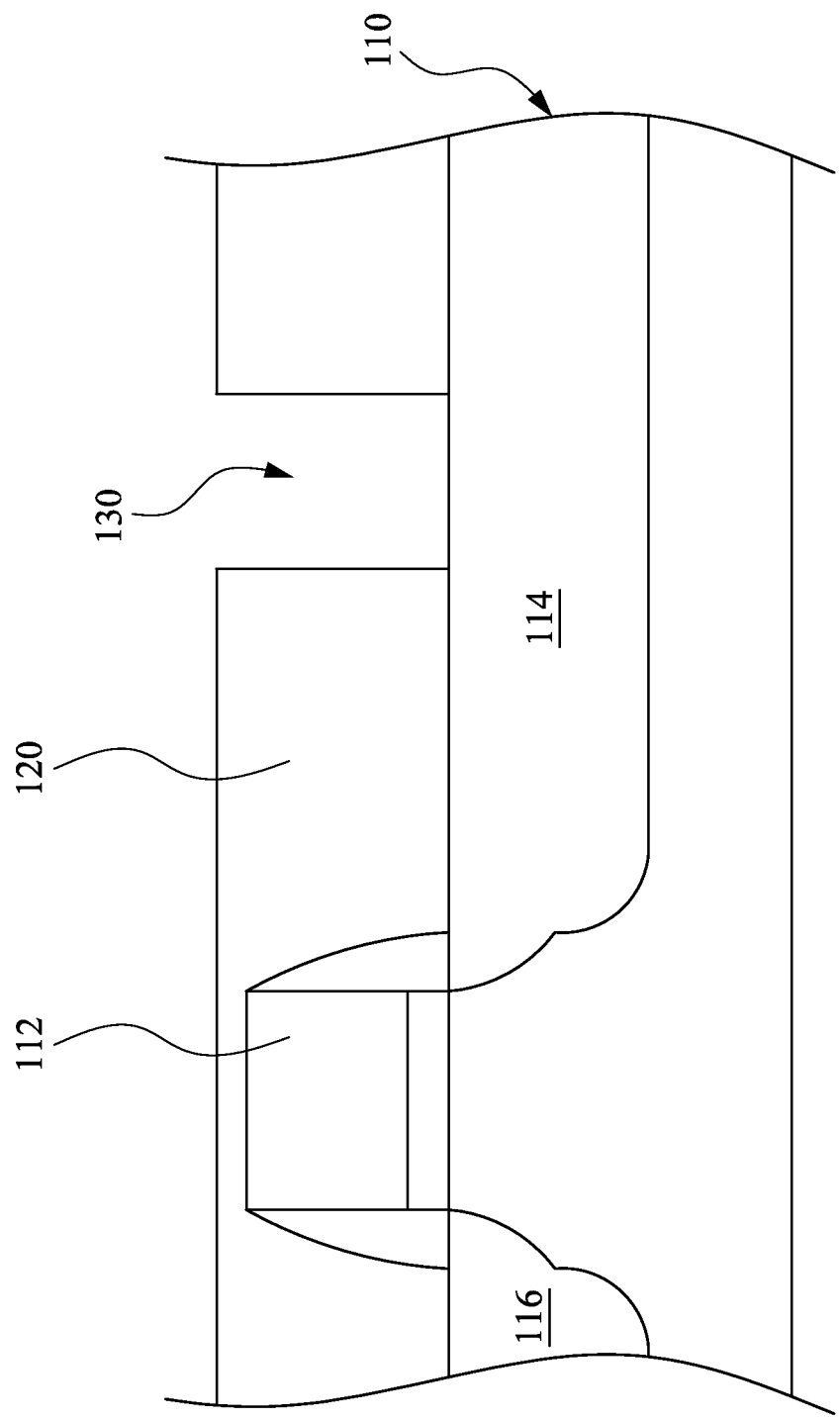

Referring to FIG. 2, a first dielectric layer 120 is formed over the semiconductor substrate 110 in a blanket manner, and thereafter an opening 130 is formed within the first dielectric layer 120. In some embodiments, the first dielectric layer 120 may be an inter-layer dielectric (ILD) layer and made of a material such as, for example, undoped silica glass (USG), borosilicate glass (BSG), borophosphosilicate (BPSG), and the like. Any suitable method may be employed to form the first dielectric layer 120. For example, chemical vapor deposition (CVD) techniques, plasma-enhanced CVD (PECVD) techniques, and the like may be utilized. In yet some embodiments, the first dielectric layer 120 covers the metallic gate electrode 112. In yet some embodiments, the opening 130 penetrates through the first dielectric layer 120, and thereby exposing a portion of the semiconductor substrate 110. In one example, the opening 130 is positioned on at least one of the source region 114 or the drain region 116.

Figure 3:
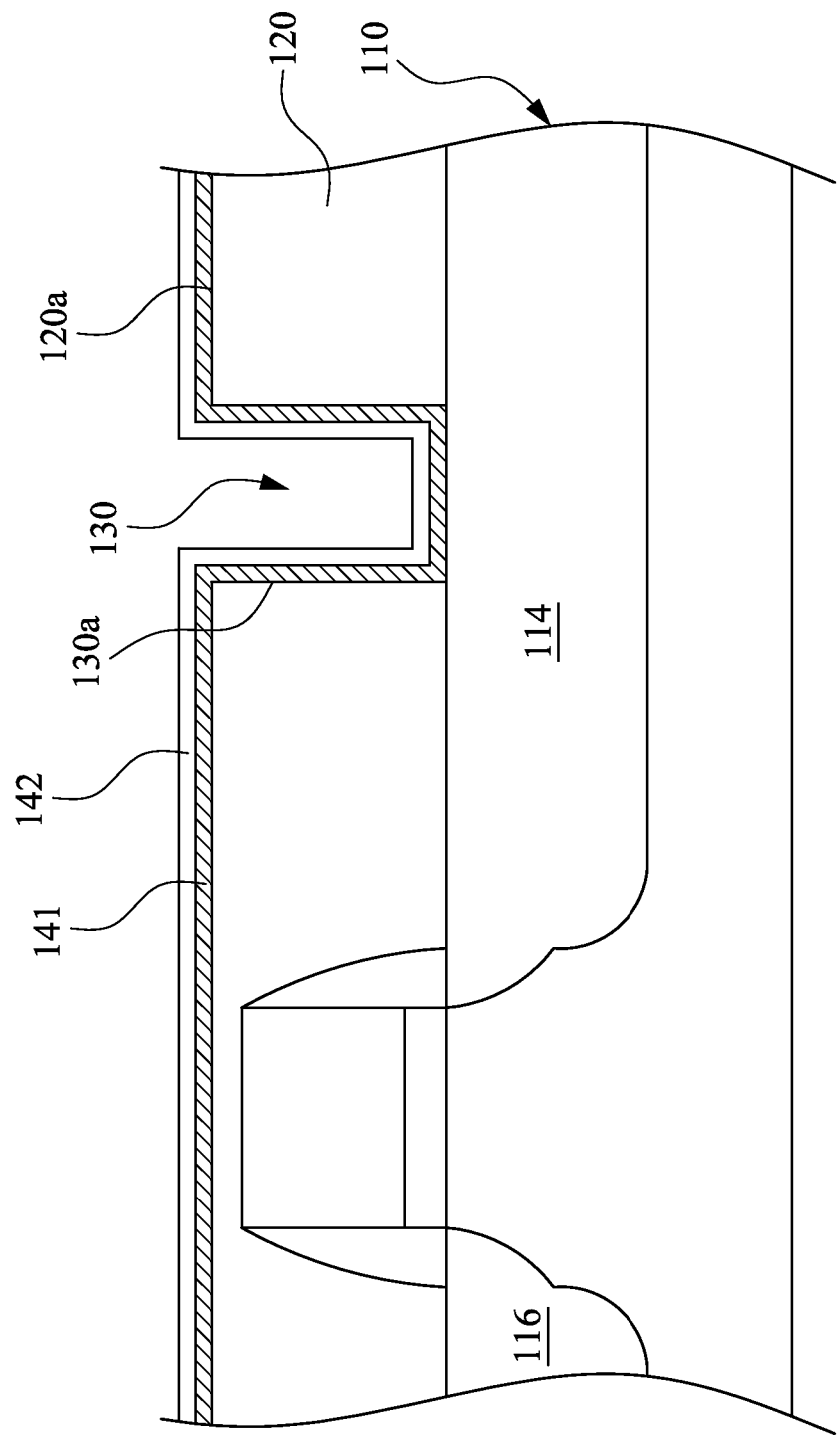
Figure 4:
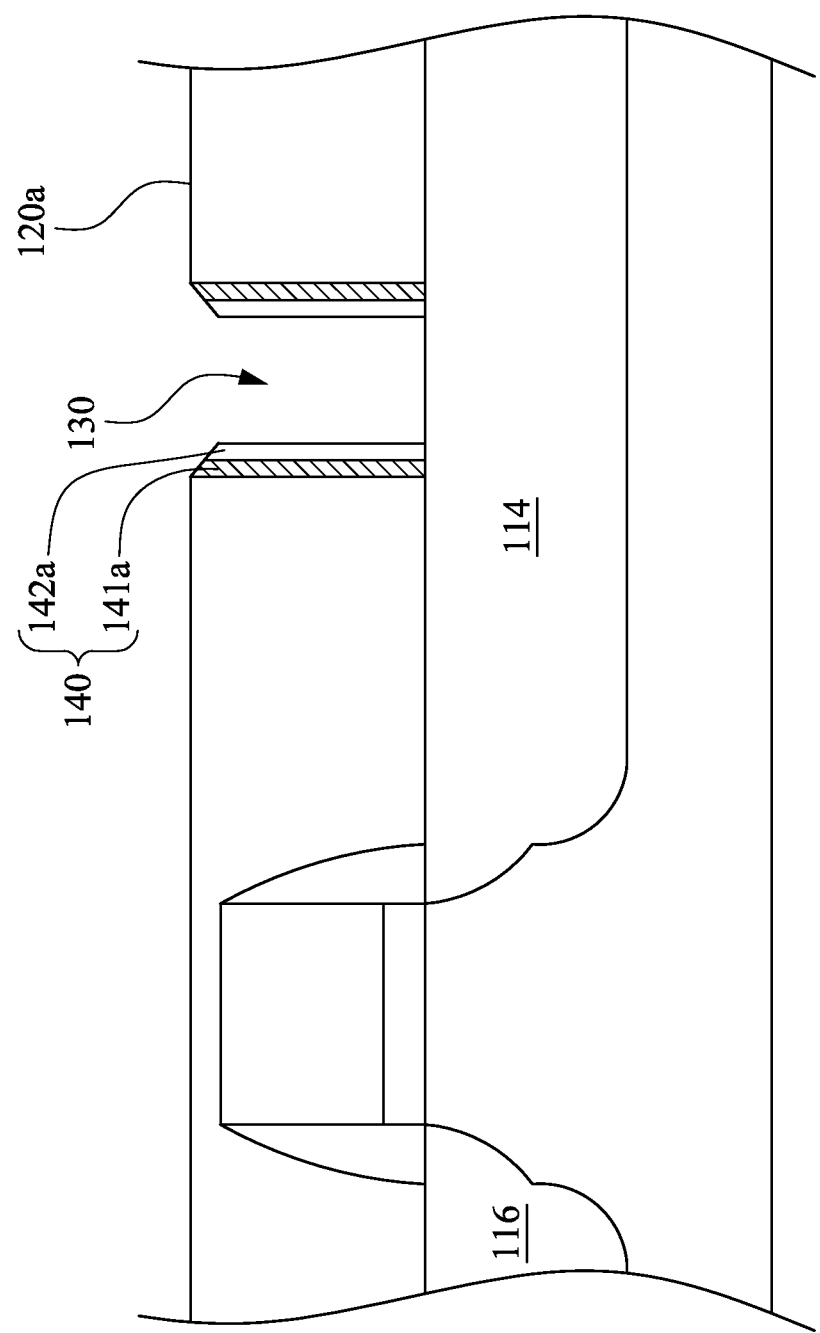

Subsequently, a multi-layered anti-etch structure is formed to cover a sidewall of the opening. FIG. 3 and FIG. 4 are cross-sectional views schematically illustrating approaches of forming the multi-layered anti-etch structure according to various embodiments of the present disclosure. In some embodiments, as shown in FIG. 3, a first anti-etch layer 141 is formed on a top surface 120a of the first dielectric layer 120, a sidewall 130a of the opening 130 and the exposed portion of the semiconductor substrate 110. Thereafter, a second anti-etch layer 142 is formed to cover the first anti-etch layer 141. In some embodiments, the second anti-etch layer 142 is conformally formed over the first anti-etch layer 141 in a blanket manner. In one example, the second anti-etch layer 142 is in contact with the first anti-etch layer 141, as shown in FIG. 3. Nevertheless, in yet some embodiments, another anti-etch layer or barrier later may be interposed between the first anti-etch layer 141 and the second anti-etch layer 142.

The first anti-etch layer 141 includes a material having resistance to peroxide such as for example hydrogen peroxide ($H_2O_2$). In some embodiments, the first anti-etch layer 141 is a silicon-based material layer including at least one of oxygen or nitrogen. For example, the first anti-etch layer 141 may be made of silicon oxide, silicon nitride or the like. Furthermore, the second anti-etch layer 142 includes a material having resistance to acid such as for example sulfuric acid ($H_2SO_4$) and hydrogen fluoride (HF). In some embodiments, the second anti-etch layer 142 may be made of silicon carbide (SiC) or the like. In examples, the thickness of the first anti-etch layers 141 is about 5 angstrom to about 20 angstrom, and the second anti-etch layers 142 has a thickness of about 20 angstrom to about 50 angstrom. According to some embodiments of the present disclosure, the first and second anti-etch layers 141, 142 may be formed by CVD techniques or other suitable deposition operations. As one of ordinary skill in the art will appreciate that the above examples are provided for illustrative purposes only to further explain applications of some illustrative embodiments and are not meant to limit the disclosure in any manner.

Subsequently, a portion of the first anti-etch layer 141 and a portion of the second anti-etch layer 142 are removed as shown in FIG. 4, and thereby forming the multi-layered anti-etch structure 140 on the sidewall of the opening 130 according to some embodiments of the present disclosure. For instance, Argon (Ar) sputter etching may be employed to remove parts of the first and second anti-etch layers 141, 142 such that the portions of the first and second anti-etch layers 141, 142 positioned on the top surface 120a of the first dielectric layer 120 are removed. Simultaneously, the portions of the first and the second anti-etch layers 141, 142 positioned on the bottom of the opening 130 are removed as well, and thereby exposing the semiconductor substrate 110 within the opening 130. The remaining portions of the first and second anti-etch layers 141a, 142a constitute the multi-layered anti-etch structure 140 on the sidewall of the opening 130. In some embodiments, the multi-layered anti-etch structure 140 covers the entire sidewall of the opening 130. In yet some embodiments, the first anti-etch layer 141a and the second anti-etch layer 142a are positioned on at least one of the source region 114 or the drain region 116, as shown in FIG. 4. One skilled in the art will appreciate that a single opening is shown for illustrative purposes only. As such, some embodiments may include a plurality of openings 130 and/or a plurality of multi-layered anti-etch structures 140 each formed on the sidewall of a corresponding opening.

In some embodiments, after forming the multi-layered anti-etch structure 140, a cleaning process is performed on the obtained structure. In examples, a cleaning solution or detergent containing hydrogen fluoride (HF), sulfuric acid ($H_2SO_4$) and hydrogen peroxide ($H_2O_2$) is applied onto the obtained semiconductor structure to remove particles. The second anti-etch layer 142a of the multi-layered anti-etch structure 140 serves as a layer resistant to the acid components in the cleaning solution so that the critical dimension (CD) and the shape of the opening 130 may be secured.

Figure 5:
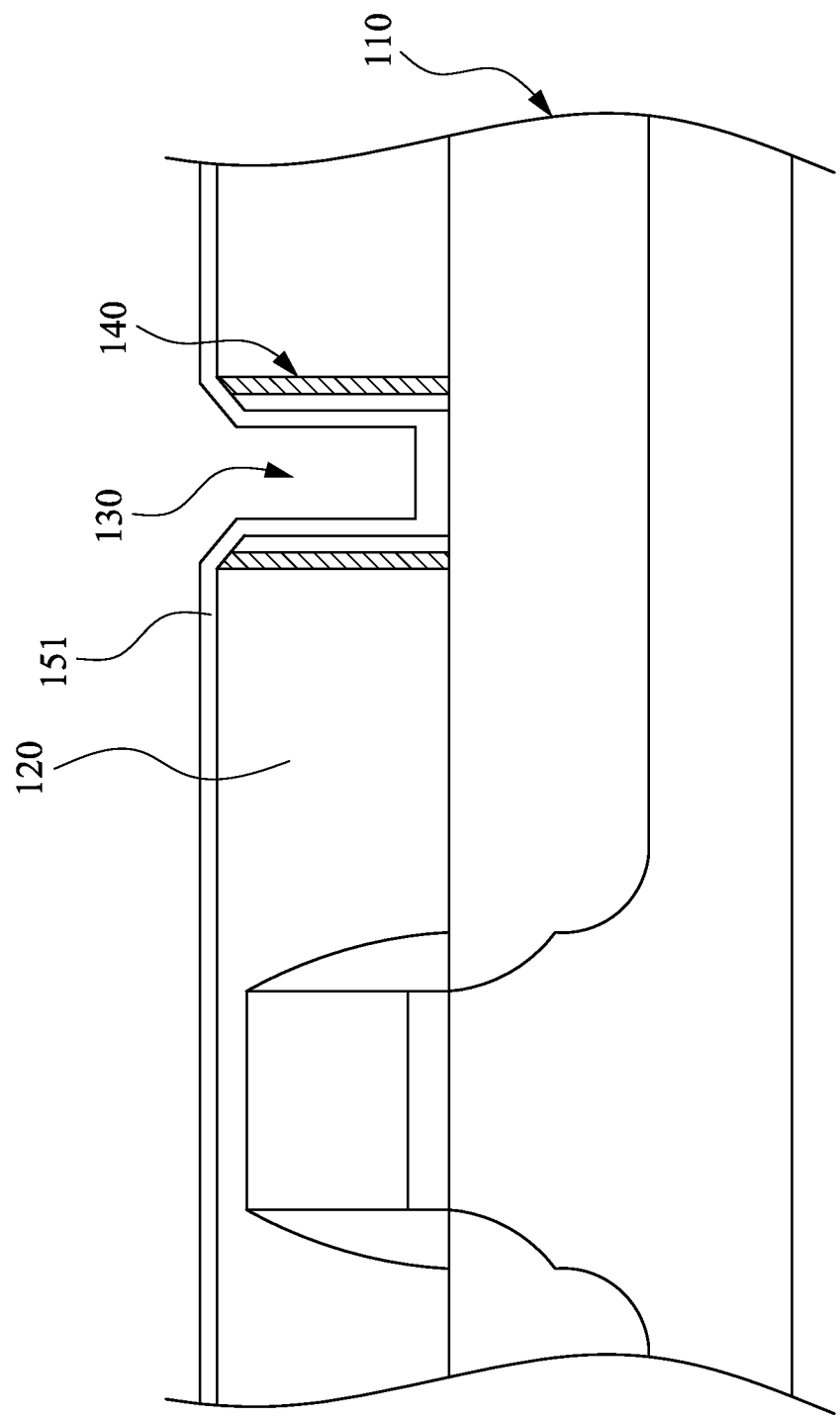
Figure 6:
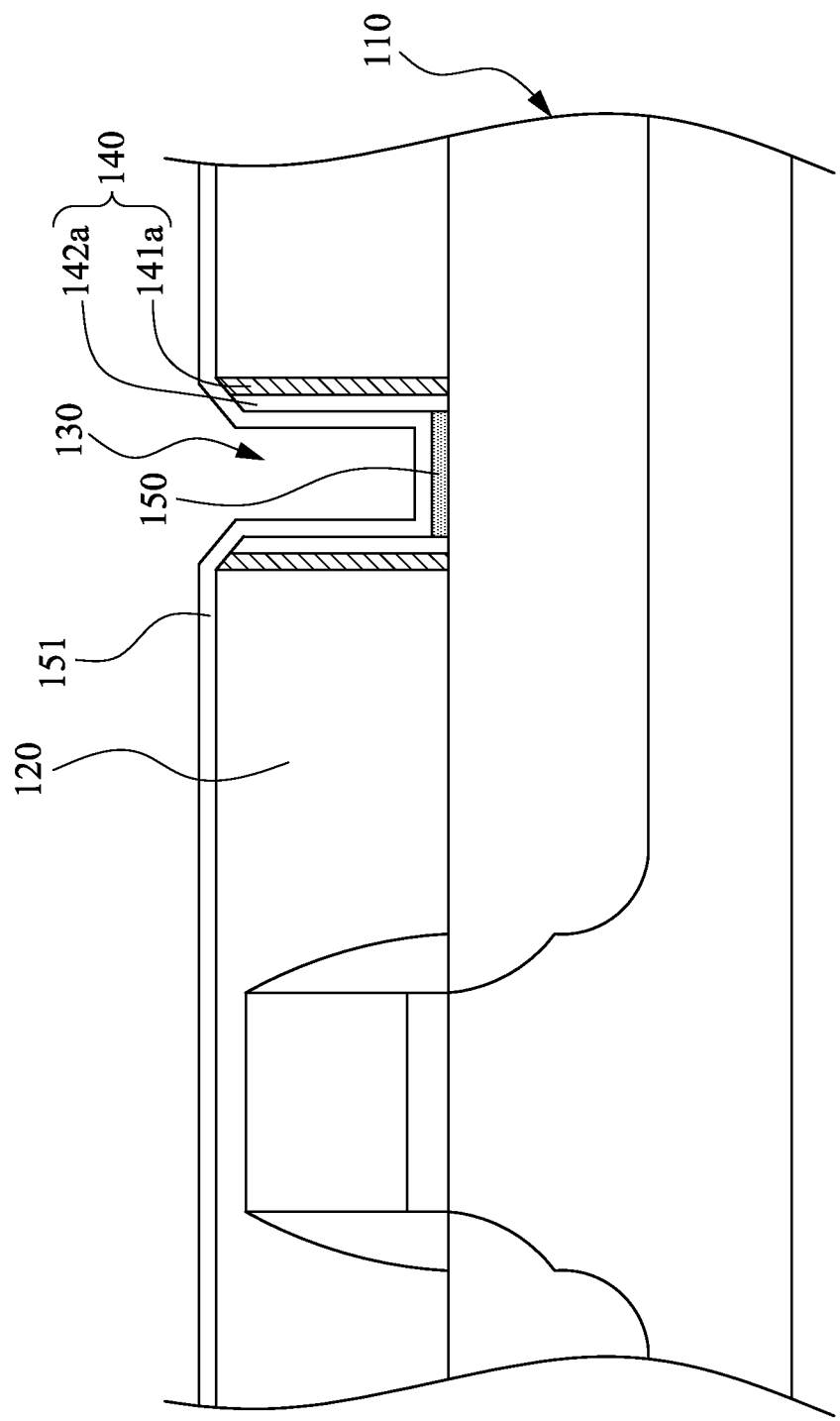
Figure 7:
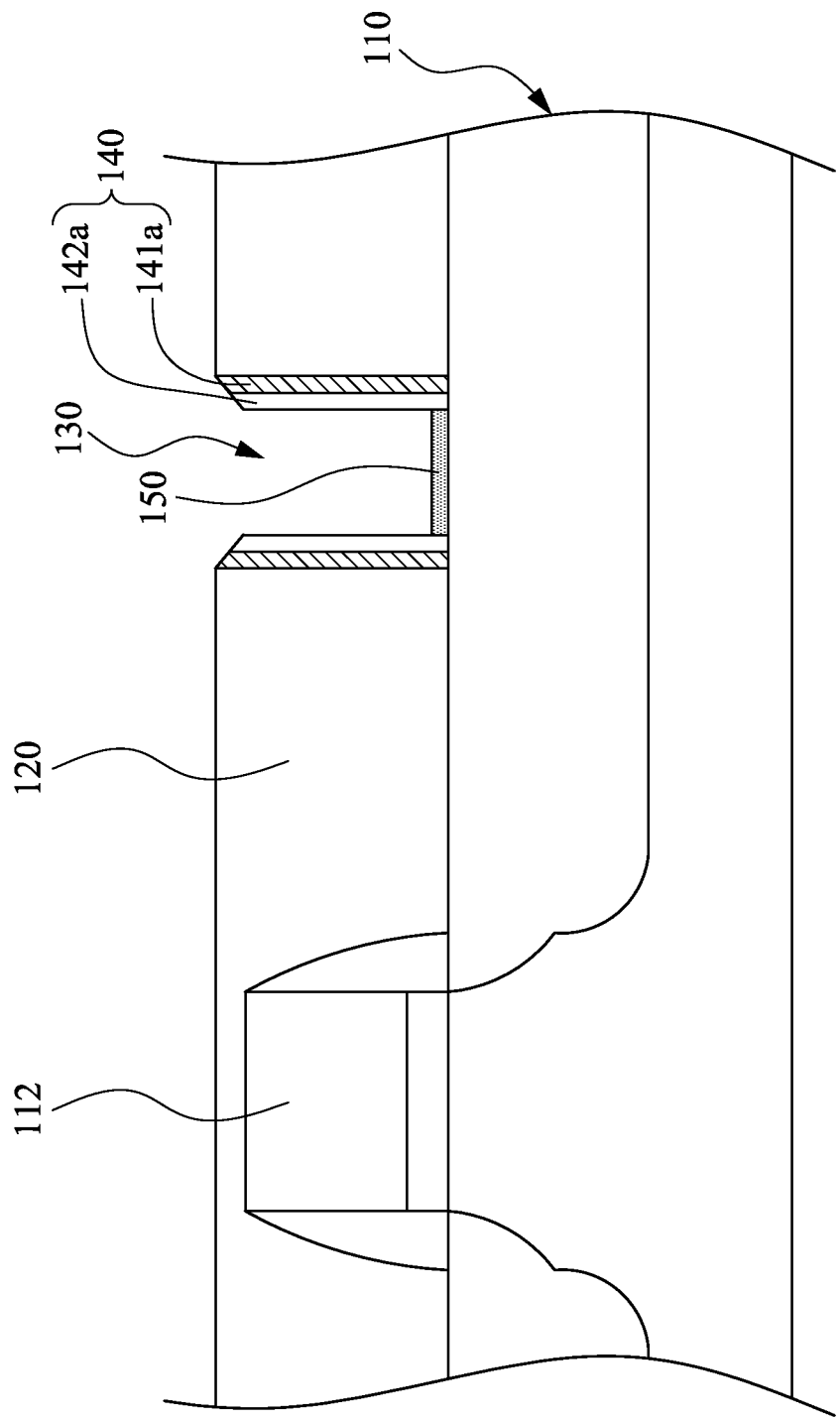

A conductivity-enhancing layer such as for example a NiSi layer is formed on the bottom of the opening after forming the multi-layered anti-etch structure 140. FIGS. 5-7 are cross-sectional views schematically illustrating approaches of forming the conductivity-enhancing layer according to various embodiments of the present disclosure.

In some embodiments, as shown in FIG. 5, a composite layer 151 including nickel (Ni) and titanium nitride (TiN) are deposited on the first dielectric layer 120, the multi-layered anti-etch structure 140 and the exposed portion of the semiconductor substrate 110 in the opening 130. In some embodiments, the composite layer 151 has a multiple-layered structure including a Ni layer and a TiN layer stacked on the Ni layer. A portion of the Ni layer is in contact with the exposed portion of semiconductor substrate 110 in the opening 130. In yet some embodiments, the composite layer 151 includes an alloy of Ni and TiN.

In some embodiments, as shown in FIG. 6, the composite layer 151 including Ni and TiN is heated such that the composite layer 151 reacts with the exposed portion of the semiconductor substrate 110, and thereby forming the conductivity-enhancing layer 150. In some embodiments, a thermal process such as rapid thermal anneal (RTA) is utilized to form the conductivity-enhancing layer 150. In examples, the semiconductor substrate 110 includes silicon, and the obtained conductivity-enhancing layer 150 includes nickel silicide (NiSi).

It is discovered that the second anti-etch layer 142a such as a SiC layer is undesirably changed in nature when heating the composite layer 151 to form the conductivity-enhancing layer 150. Without being bound to any theory, it is believed that parts of the SiC layer is converted into TiC due to the reaction of SiC with TiN of the composite layer 151. The SiC layer has an excellent resistance to chemicals such as acid, base and peroxide. However, TiC can not provide resistance to certain peroxide such as hydrogen peroxide ($H_2O_2$), and leads to some problems. In this regards, the multi-layered anti-etch structure 140 formed on the sidewall of the opening is configured to resolve these problems, which is described in detail hereinafter.

In some embodiments, as shown in FIG. 7, the unreacted portion of the composite layer 151 is removed after forming the conductivity-enhancing layer 150. In yet some embodiments, acid and peroxide are applied onto the semiconductor substrate after or during removing the unreacted portion of the composite layer 151. For example, a solution including sulfuric acid ($H_2SO_4$) and hydrogen peroxide ($H_2O_2$) is applied onto the semiconductor substrate to remove particles. In yet some embodiments, base and peroxide are applied onto the semiconductor substrate after or during removing the unreacted portion of the composite layer 151. For example, a solution including ammonium hydroxide ($NH_4OH$) and hydrogen peroxide ($H_2O_2$) is applied onto the semiconductor substrate to remove particles.

If a single SiC layer is used as an anti-each layer on the sidewall of the opening 130 (i.e., without the first anti-each layer), the metallic gate electrode 112 is possibly etched. As described hereinbefore, it is believed that parts of the SiC layer are converted into TiC when heating the composite layer 151 to form the conductivity-enhancing layer 150. The applied hydrogen peroxide ($H_2O_2$) may etch and dissolve the TiC portions of the SiC layer so that weakness or faults appear in the SiC layer. Moreover, the applied sulfuric acid ($H_2SO_4$) may penetrate the weakness or faults of the SiC layer and reach the metallic gate electrode 112 through some paths in the structure, and thereby etching the metallic gate electrode 112. Consequently, according to various embodiments of the present disclosure, the semiconductor structure disclosed herein includes a multi-layered anti-etch structure 140, which has a first anti-etch layer 141a resistant to peroxide and a second anti-etch layer 142a resistant to acid.

Figure 8:
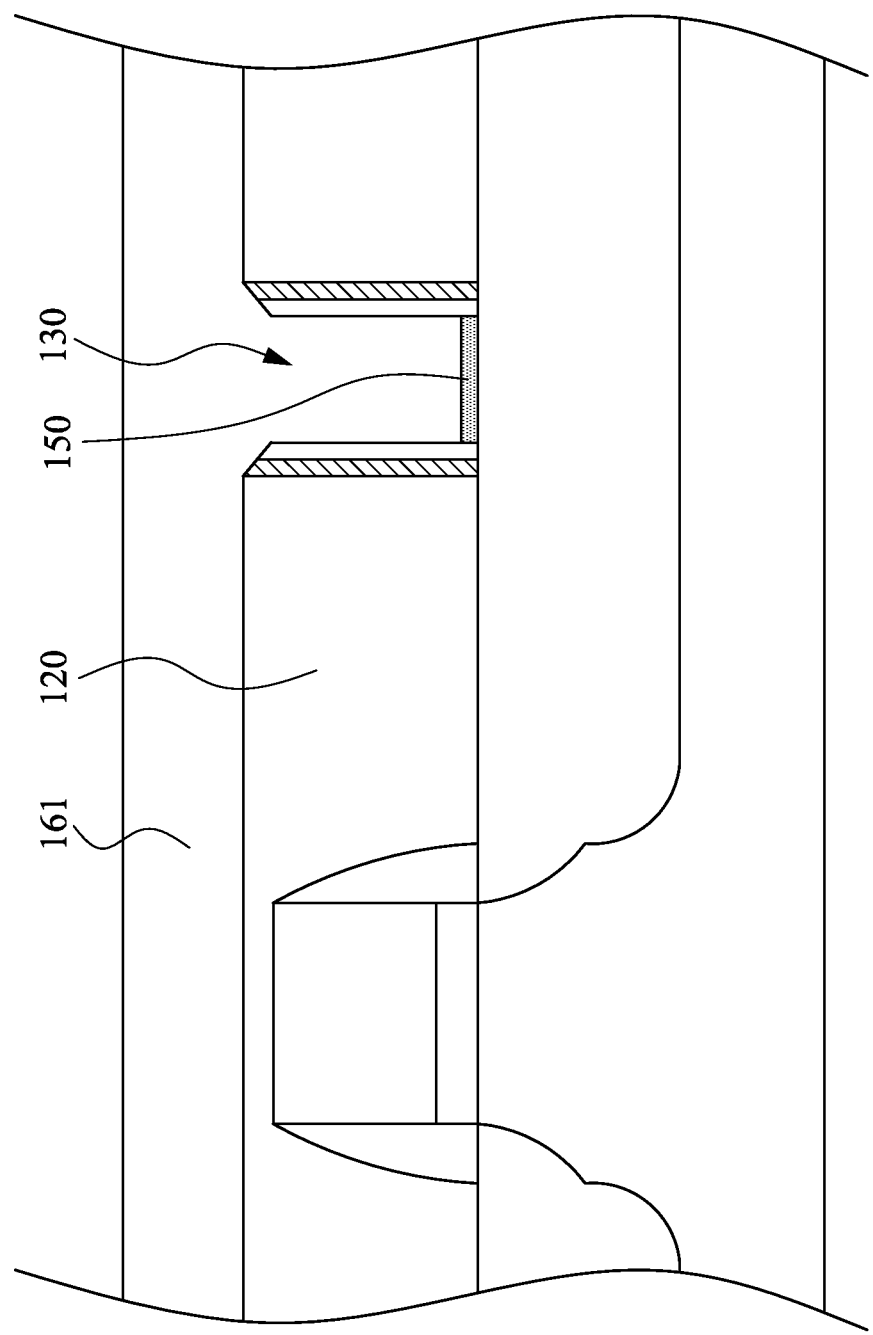
Figure 9:
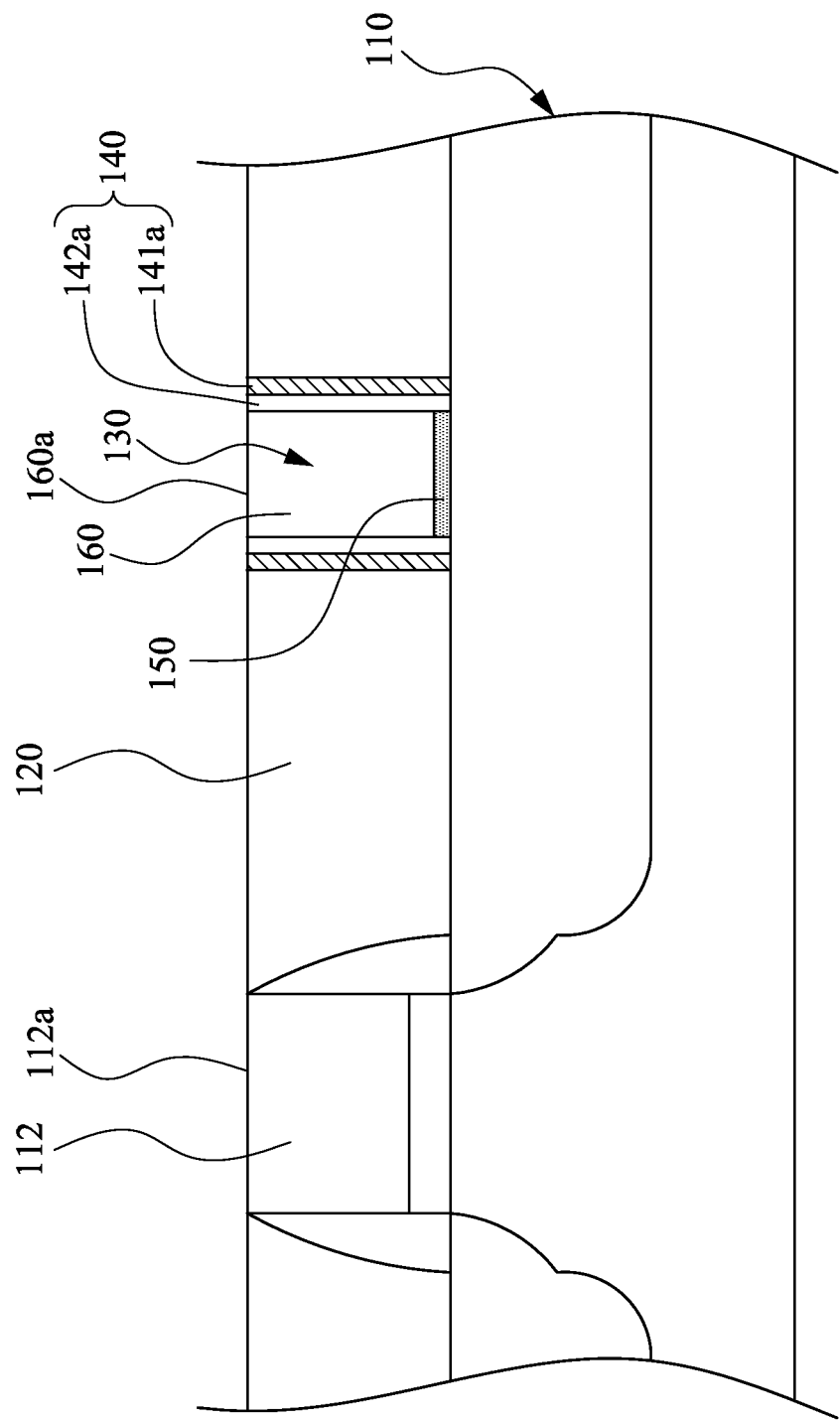

Subsequently, a conductive material is formed within the opening. FIGS. 8-9 are cross-sectional views schematically illustrating approaches of forming the conductive material according to various embodiments of the present disclosure. In some embodiments, as shown in FIG. 8, a conductive layer 161 is deposited within the opening 130 and on the first dielectric layer 120. In examples, the opening 130 is filled with the conductive layer 161 which includes tungsten (W).

In some embodiments, as shown in FIG. 9, a polish process is performed on the side of the conductive layer 161 to remove a portion of the conductive layer 161, and thereby forming a via contact such as conductive material 160 in the opening 130. In examples, a CMP process is utilized to remove the conductive layer 161 on the first dielectric layer 120, and further to remove a portion of the first dielectric layer 120 until the metallic gate electrode 112 is exposed. Accordingly, a top surface 112a of the metallic gate electrode 112 is positioned at substantially the same level as a top surface 160a of the conductive material 160 according to some embodiments of the present disclosure. In yet some embodiments, the multi-layered anti-etch structure 140 surrounds the sidewall of the conductive material 160. In one example, the second anti-etch layer 142a is in contact with the conductive material 160 and covers the entire sidewall of the conductive material 160. Furthermore, the second anti-etch layer 142a is interposed between the conductive material 160 and the first anti-etch layer 141a. In yet some embodiments, the conductivity-enhancing layer 150 such as a NiSi layer is disposed between the conductive material 160 and the semiconductor substrate 110.

According to various embodiments of the present disclosure, one or more dielectric layers and via contacts may be formed over the first dielectric layer 120. In some embodiments, as shown in FIG. 10, a second dielectric layer 170 is formed on the first dielectric layer 120. The second dielectric layer 170 has a second opening 172 overlapped with the first opening 130. In one example, the diameter of the second opening 172 is greater than that of the first opening 130. In yet some embodiments, a third anti-etch layer 174 may be formed on the sidewall of the second opening 172. In one example, the third anti-etch layer 174 is made of a material the same as the second anti-etch layer 142a which is resistant to acid. In some embodiments, a contact etching stop layer (CESL, not shown in FIG. 10) may be formed between the first dielectric layer 120 and the second dielectric layer 170. In yet some embodiments, a conductive column 176 serving as a via contact is formed within the second opening 172. The conductive column 176 is in contact with the conductive material 160. In one example, the conductive column 176 has a bottom surface 176b positioned at the same level as the top surface 112a of the metallic gate electrode 112.

In accordance with one aspect of some embodiments, a semiconductor structure includes a semiconductor substrate, a first dielectric layer, a first anti-etch layer, a second anti-etch layer, and a conductive material. The first dielectric layer is formed over the semiconductor substrate and has a first opening. The first anti-etch layer is made of a material having resistance to peroxide and is formed on the sidewall of the first opening. The second anti-etch layer is made of a material having resistance to acid and is formed over the first anti-etch layer. The conductive material is formed within the first opening and in contact with the second anti-etch layer.

In accordance with another aspect of some embodiments, a semiconductor structure includes a semiconductor substrate, a dielectric layer overlaying the semiconductor substrate, and a contact structure. The semiconductor substrate has a metal gate, a source region and a drain region. The dielectric layer has an opening through the dielectric layer and positioned over at least one of the source region or the drain region. The contact structure is formed in the opening, and includes a first anti-etch layer, a second anti-etch layer and a conductive material. The first anti-etch layer is disposed on a sidewall of the opening, in which the first anti-etch layer is resistant to peroxide. The conductive material is disposed within the opening. The second anti-etch layer is interposed between the conductive material and the first anti-etch layer, in which the second anti-etch layer is resistant to acid.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   a semiconductor substrate;
   a first dielectric layer formed over the semiconductor substrate and having a first opening, wherein the first opening has a sidewall;
   a first anti-etch layer made of a material having resistance to peroxide and formed on the sidewall of the first opening;
   a second anti-etch layer overlying the first anti-etch layer and made of a material having resistance to acid; and
   a conductive material formed within the first opening and in contact with the second anti-etch layer.

2. The semiconductor structure according to claim 1, wherein the second anti-etch layer is in contact with the first anti-etch layer.

3. The semiconductor structure according to claim 1, wherein the second anti-etch layer comprises silicon carbide.

4. The semiconductor structure according to claim 1, wherein the first anti-etch layer is a silicon-based material layer comprising at least one of oxygen or nitrogen.

5. The semiconductor structure according to claim 1, wherein the semiconductor substrate comprises a metallic gate electrode, a source region and a drain region, the source and drain regions being arranged at opposite sides of the metallic gate electrode.

6. The semiconductor structure according to claim 5, wherein the metallic gate electrode has a top surface positioned at substantially the same level as a top surface of the conductive material.

7. The semiconductor structure according to claim 5, wherein the first anti-etch layer and the second anti-etch layer are positioned over at least one of the source region or the drain region.

8. The semiconductor structure according to claim 5, further comprising:
   a second dielectric layer formed over the first dielectric layer, wherein the second dielectric layer has a second opening overlapped with the first opening;
   a third anti-etch layer formed on a sidewall of the second opening; and
   a conductive column formed within the second opening and in contact with the third anti-etch layer and the conducive material.

9. The semiconductor structure according to claim 8, wherein the conductive column has a bottom surface positioned at substantially the same level as a top surface of the metallic gate electrode.

10. The semiconductor structure according to claim 8, wherein the second opening has a diameter that is greater than a diameter of the first opening.

11. The semiconductor structure according to claim 1, further comprising a nickel silicide (NiSi) layer disposed between the conductive material and semiconductor substrate.

12. The semiconductor structure according to claim 1, wherein the first opening penetrates through the first dielectric layer.

13. A semiconductor structure, comprising:
    a semiconductor substrate having a metal gate, a source region and a drain region;
    a dielectric layer overlaying the semiconductor substrate and having an opening through the dielectric layer and positioned over at least one of the source region or the drain region; and
    a contact structure formed in the opening, the contact structure comprising:
        a first anti-etch layer disposed on a sidewall of the opening, wherein the first anti-etch layer is resistant to peroxide;
        a conductive material disposed within the opening; and
        a second anti-etch layer interposed between the conductive material and the first anti-etch layer, wherein the second anti-etch layer is resistant to acid.

14. A method of forming a semiconductor structure, comprising:
    forming a dielectric layer over a semiconductor substrate,
    forming an opening through the dielectric layer and exposing a portion of the semiconductor substrate;
    forming a multi-layered anti-etch structure covering a sidewall of the opening, wherein the multi-layered anti-etch structure comprises a first anti-etch layer which is resistant to peroxide, and a second anti-etch layer which is resistant to acid, wherein the first anti-etch layer is in contact with the sidewall of the opening;
    forming a conductivity-enhancing layer over the exposed portion of the semiconductor substrate; and
    forming a conductive material within the opening.

15. The method according to claim 14, wherein the act of forming the multi-layered anti-etch structure comprising:
    forming the first anti-etch layer over a top surface of the dielectric layer, the sidewall of the opening and the exposed portion of the semiconductor substrate;
    forming the second anti-etch layer to cover the first anti-etch layer; and
    removing a portion of the first anti-etch layer and a portion of the second anti-etch layer poisoned over the top surface of the dielectric layer and over the exposed portion of the semiconductor substrate, thereby forming the multi-layered anti-etch structure on the sidewall of the opening.

16. The method according to claim 15, wherein the act of forming the first anti-etch layer comprises depositing a layer comprising at least one of silicon oxide or silicon nitride.

17. The method according to claim 15, wherein the act of forming the second anti-etch layer comprises depositing a silicon carbide layer.

18. The method according to claim 14, wherein the act of forming the conductivity-enhancing layer comprises:
    depositing a composite layer comprising nickel (Ni) and titanium nitride (TiN) over the dielectric layer, the multi-layered anti-etch structure and the exposed portion of the semiconductor substrate;
    heating the composite layer comprising Ni and TiN such that the exposed portion of the semiconductor substrate reacts with the composite layer to form the conductivity-enhancing layer; and
    removing an unreacted portion of the composite layer.

19. The method according to claim 18, further comprising applying acid and peroxide onto the semiconductor substrate after or during removing the unreacted portion of the composite layer.

20. The method according to claim 14, wherein the act of providing the semiconductor substrate comprises forming a metal gate thereon, and the act of forming the dielectric layer comprises allowing the dielectric layer to cover the metal gate, wherein
    the act of forming the conductive material within the opening comprises:
    depositing a conductive layer within the opening and over the dielectric layer; and
    polishing the conductive layer and the dielectric layer to expose the metal gate out of the dielectric layer.

* * * * *